(12) United States Patent
Maeda et al.

(10) Patent No.: US 7,132,388 B1
(45) Date of Patent: Nov. 7, 2006

(54) HIGH-TEMPERATURE OXIDE SUPERCONDUCTOR

(75) Inventors: Hiroshi Maeda, Tsukuba (JP); Yoshiaki Tanaka, Tsukuba (JP); Masao Fukutomi, Tsukuba (JP); Toshihisa Asano, Tsukuba (JP)

(73) Assignee: National Research Institute for Metals, Tokyo (JP)

( * ) Notice: Subject to any disclaimer, the term of this patent is extended or adjusted under 35 U.S.C. 154(b) by 0 days.

(21) Appl. No.: 07/293,465

(22) Filed: Jan. 4, 1989

(30) Foreign Application Priority Data

Jan. 20, 1988 (JP) .................................. 63-10084

(51) Int. Cl.
*C04B 101/00* (2006.01)
*H01L 12/00* (2006.01)

(52) U.S. Cl. ..................................... 505/121; 505/782

(58) Field of Classification Search .............. 501/1, 501/782, 800, 809, 810, 815; 252/518, 521; 505/121, 782
See application file for complete search history.

(56) References Cited

FOREIGN PATENT DOCUMENTS

DE          3739886 A1     11/1987
JP          126224/89      5/1989

OTHER PUBLICATIONS

Michel, C. et al.: "Superconductivity in the Bi-Sr-Cu-O System", Z. Phys. B., 64,. pp. 421-423, 1987.*
Maeda, H. et al, Jpn J. Appl. Phys. 27, L209-L210, Feb. 26, 1988.*
Akitmitsu, J. et al.: Superconductivity in the Bi-Sr-Cu-O System, Jpn. J. Appl. Phys., 26, pp. L2080-L2081, Dec., 1987.*

* cited by examiner

*Primary Examiner*—Mark Kopec
(74) *Attorney, Agent, or Firm*—Wenderoth, Lind & Ponack L.L.P.

(57) ABSTRACT

The present invention provides a high-temperature oxide superconductors, which comprises an oxide expressed as $(Bi_{1-x}A_x)$—B—C—Cu oxide (where, A is Sb and/or AS; B and C are elements different from each other, each being one or more elements selected from the group consisting of Be, Mg, Ca, Sr and Ba; and x is characterized by $0 \leq x \leq 1$). According to the present invention, it is possible to manufacture a high-temperature oxide superconductor having a transition temperature of over 100 K and not containg a rare-earth element at all, and to manufacture an excellent superconductor in reliability and stability easilier than doing conventional superconductors such as Y—Ba type ones.

5 Claims, 2 Drawing Sheets

HIGH-TEMPERATURE OXIDE SUPERCONDUCTOR

FIELD OF THE INVENTION

Figure 1:
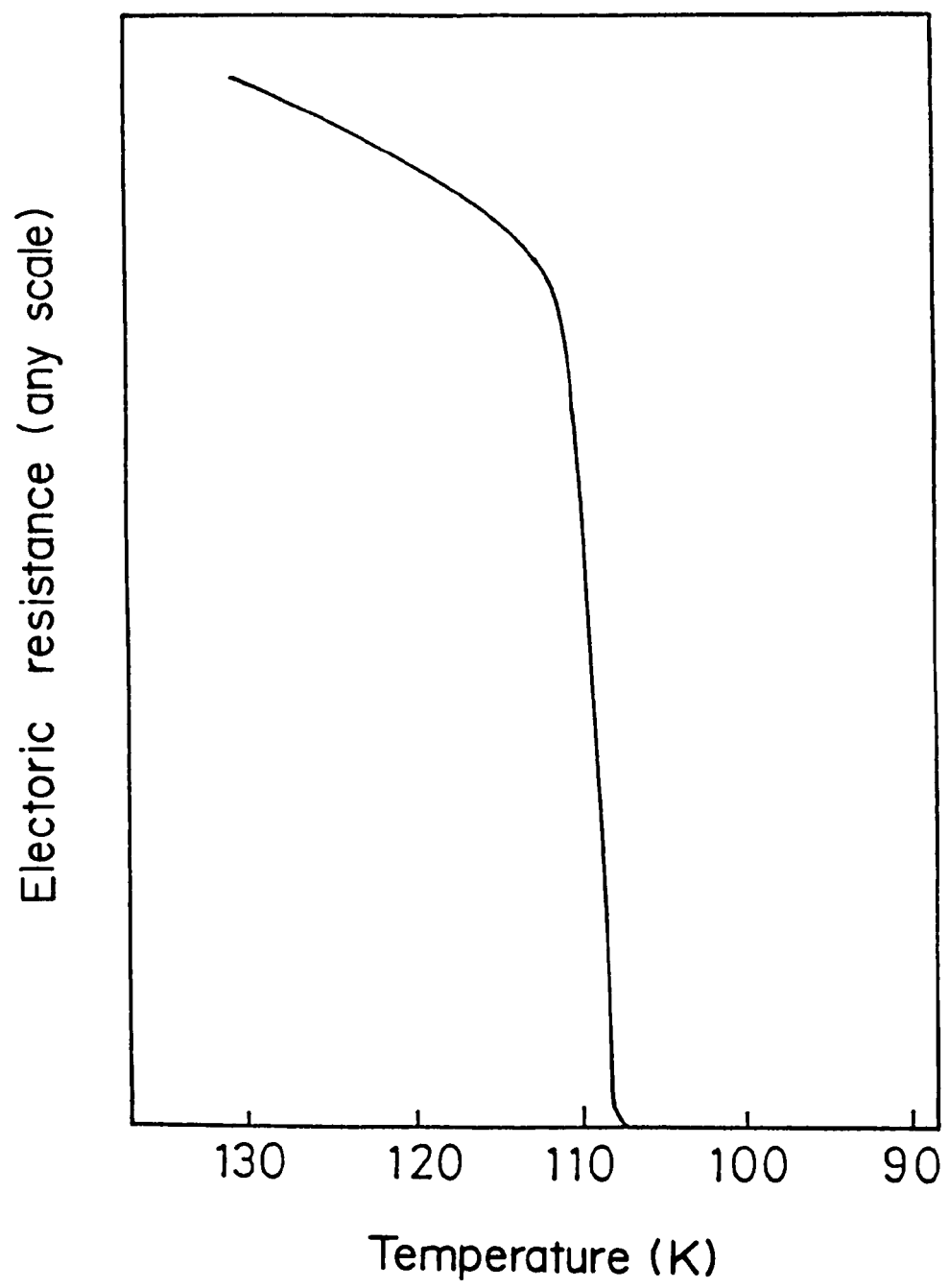

The present invention relates to a high-temperature oxide superconductor, and more particularly, to a high-temperature oxide superconductor having a very high superconductivity transition temperature of over 100K, not containing a rare-earth element at all.

DESCRIPTION OF THE PRIOR ART

High-temperature oxide superconductor are attracting the general attention as having a high superconductivity transition temperature far exceeding that of a superconductor comprising an alloy such as Nb—Ti, $Nb_3Sn$ or $V_3Ga$ or an intermetallic compound, and are expected to serve as wires, tapes and disk-shaped sinters in such a side range of area as from strong electricity areas such as superconductor magnet for high magnetic field and superconductive magnetic energy storage to various materials for cryoelectronic components such as Josephson device and SQUID and to sheet materials for magnetic shield.

Known high-temperature oxide superconductors conventionally include 30K-class $(La_{1-x}Ba_x)CuO_4$ and 40K-class ones as represented by $(La_{1-x}Sr_x)CuO_4$ as the first-generation materials, followed by the more recent appearance of a 90K-class oxide superconductor of $YBa_2Cu_3O_{7-\delta}$. The keen development competition thereafter revealed that all the materials achieved by replacing Y (yttrium) of $YBa_2Cu_3O_{7-\delta}$ by another rare-earth element (other than Sc, Ce, Pr, Pm and Tb) are superconductors having a 90K-class superconductivity transition temperature (Tc), and have been generally recognized as second-generation high-temperature oxide superconductors.

These Y—Ba type oxide superconductors pose however problems in that their properties are very sensitive to lack of oxygen ($\delta$) and superconductivity cannot be obtained unless structural transformation of tetragonal and rhombic crystal grains is subtly controlled during the process of heat treatment i.e., it is very difficult to conduct proper heat treatment.

Furthermore, these conventional superconductors are unstable relative to moisture and coarbon dioxide gas because of the presence of a rare-earth element, thus resulting in many difficult problems in the manufacture of high-performance wires, thin films or the like. In addition, rare-earth elements are uncertain in supply because of the worldly maldistribution of resources, leading to high prices.

Since the appearance of these Y—Ba type high-temperature oxide superconductors, research and development efforts have been actively in progress throughout the whole world in an attempt to achieve a higher Tc, and materials having a Tc of 200K, room temperature or even in excess of 300K have been announced, although none of these materials have as yet been recognized for the lack of an established evidence of superconductivity.

There is therefore a strong demand for the achievement of a high-temperature oxide superconductor superior to Y—Ba type ones.

OBJECT OF THE INVENTION

The present invnetion was made in view of the circumstances as described above, and has an object to overcome the problems involved in the conventional oxide superconductors and provide a new high-temperature oxide superconductor of the 100K to 110K class which is stable and permits easy heat treatment, without the use of a rare-earth element.

This and other objects, features and advantages of the invention will become more apparent in the detailed description with refference to the drawings and examples which follow.

BRIEF DESCRIPTION FO THE DRAWINGS

Figure 2:
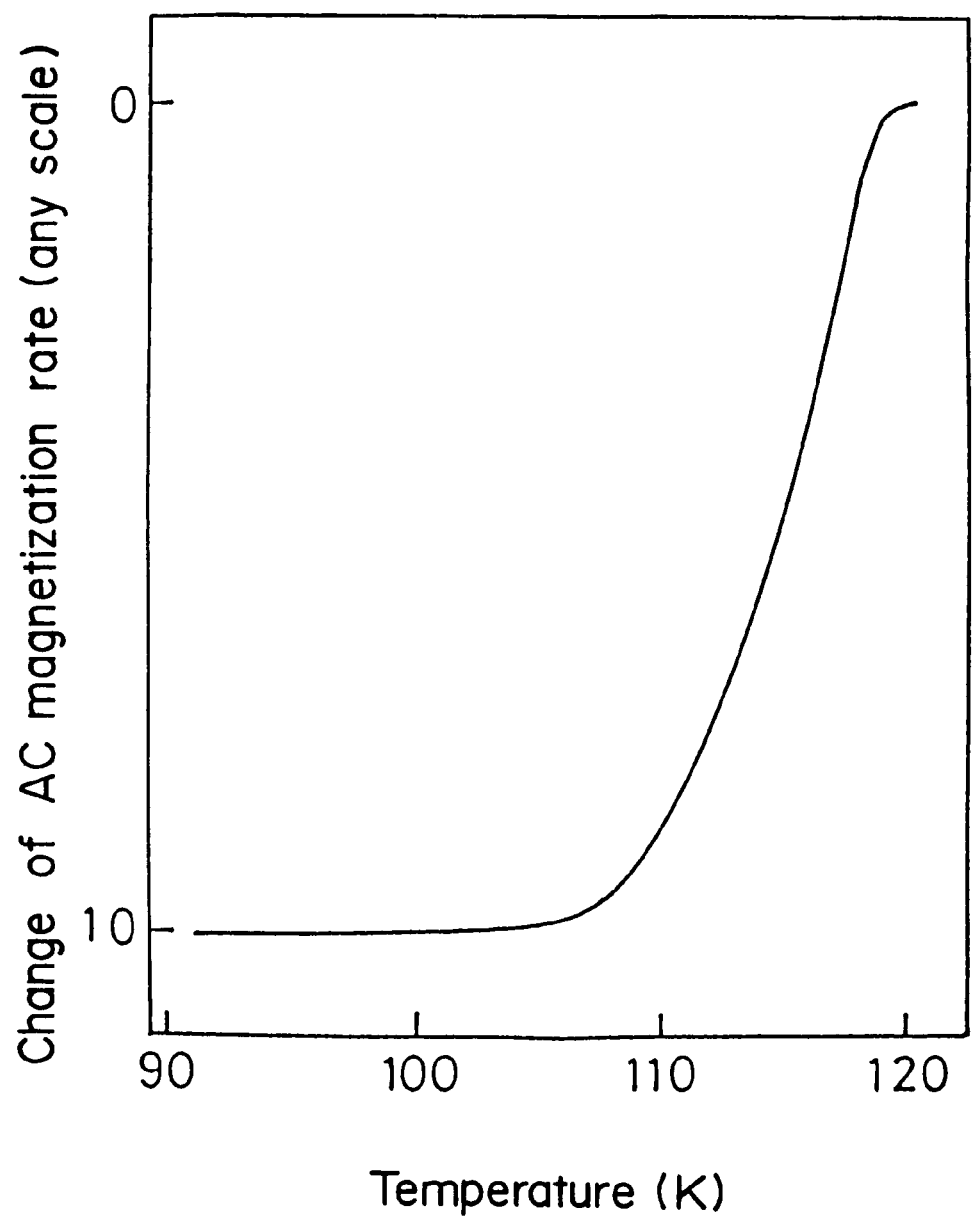

FIG. 1 is an electric resistance-temperature curve diagram illustrating an embodiment of the present invention; and FIG. 2 is a superconductivity transition curve diagram obtained through measurement of AC magnetization rate.

DETAILED DESCRIPTION OF THE PREFERED EMBODIMENTS

The present invention provides a high-temperature oxide superconductor which comprises an oxide expressed as $(Bi_{1-x}A_x)$—B—C—Cu oxide (where, A is Sb and/or As; B and C are elements difference from each other, each being one or more elements selected from the group consisting of Be, Mg, Ca, Sr and Ba; and x is characterized by $0 \leq x \leq 1$).

In an oxide of this chemical composition, it is essential to combine Bi (bismuth) and Cu (copper), as well as two or more elements selected from the group consisting of Be, Mg, Ca, Sr, and Ba, Sb and As, which fall under the same periodic family (Family 5a) as Bi, may be used as partial substitution elements of Bi, although any of Be, Mg, Ca, Sr and Ba may be combined, the combination of Sr and Ca is particularly preferable.

The oxide of the present invention should preferably have a chemical composition of $(Bi_{1-x}A_x)$—$B_y$—$C_z$—$Cu_{2+\delta}$—O under the conditions of, for example, $0 \leq x \leq 1$, $0 \leq y \leq 5$, $0 \leq z \leq 5$ and $-1 \leq \delta$, and more preferably, $0.1 \leq y \leq 5$, and $0.1 \leq z \leq 5$. A composition with y and z of under 0.1 and over 5 leads to a decreased transition temperature (Tc). Further preferably, a composition with x=0, Sr and Ca selected as B and C, and approximately y=z=1 and Cu=2 gives an excellent superconductivity.

After blending compounds such as oxides, carbides and carbonates of the component elements at prescribed ratios and mixing them sufficiently, the oxide of the present invention may be calcined at a temperature of from about 700 to 900° C. for a period of from several to 20 hours, crushed, formed into pellets, and then sintered at a temperature of from about 800 to 900° C. It is needless to mention that there is no particular limitation in temperature and other conditions.

In this sintering, it is desirable to keep the oxide in a semi-molten state. Conventional cooling may be applied after sintering. It is not necessary to closed control these heat treatment processes as in the case of a conventional Y—Ba type oxide. A high superconductivity is available also in quenching.

The oxide superconductor of the present invention shows a transition temperature of over 105K and is excellent in reliability and stability. A high-temperature superconductor is easily available with a high reproducibility because the superconductivity of the oxide is not sensitive to heat treatment.

The oxide superconductor of the present invention can be easily formed not only into a sinter but also into a thin film. The thus formed sinter has a high density and expectantly a high critical current density (Jc).

EXAMPLE 1 TO 13

$Bi_2O_3$, $SrCO_3$, $CaCO_3$ and CuO powdery materials were blended at ratios of the respective metal elements as shown in Table 1, and mixed sufficiently. The mixture was calcined at a temperature of from 800 to 800° C. for from five to ten hours, and formed into disk-shaped pellets having a diameter of 20 mm and a thickness of about 2 mm under a pressure of 2 tons/cm² by means of a cold press. These pellets were fired in the open air at a temperature of from 800 to 900° C. for ten hours, and then furnace-cooled to the room temperature for from five to ten hours.

Strip-shaped specimens having a width of about 3 mm and a length of 20 mm were cut out of these pellets to measure electric resistance and the superconductivity transition temperature Tc by the electromagnetic induction method.

For the $Bi_1$—$Sr_1$—$Ca_1$—$Cu_2$ oxide, as shown in FIG. 1, the superconductivity transition temperature starts at about 115K, and electric resistance becomes completely null at 105K.

The result shown in FIG. 2 very well agreas with this observation: particularly a large change in magnetization rate represents the perfect diamagnetism (Meissner effects) unique to a superconductor.

The result of measurement of the transition temperature shown in Table 1 also suggests that the oxide of the present invention is a new superconductor having a Tc of over 100K.

TABLE 1

| Example No. | Composition (atomic ratio) | | | | Superconductivity transition temperature (K) | | |
|---|---|---|---|---|---|---|---|
| | Bi | Sr | Ca | Cu | Start point | Middle point | End point |
| 1 | 1 | 1 | 1 | 2 | 115 | 108 | 105 |
| 2 | 1 | 1 | 1 | 3 | 115 | 110 | 107 |
| 3 | 1 | 1 | 1 | 4 | 115 | 110 | 102 |
| 4 | 1 | 1 | 1 | 5 | 115 | 108 | 102 |
| 5 | 1 | 1 | 1 | 6 | 115 | 108 | 102 |
| 6 | 1 | 1 | 1 | 9 | 115 | 108 | 102 |
| 7 | 1 | 1 | 0.5 | 3 | 90 | 80 | 68 |
| 8 | 1 | 1 | 0.25 | 3 | 95 | 80 | 65 |
| 9 | 1 | 2 | 1 | 4 | 115 | 80 | 68 |
| 10 | 1 | 1 | 2 | 4 | 90 | 80 | 68 |
| 11 | 1 | 3 | 2 | 6 | 90 | 80 | 68 |
| 12 | 1 | 1 | 0.05 | 2 | 20K > T > 4K | | |
| 13 | 1 | 2 | 0.05 | 4 | 20K > T > 4K | | |

EXAMPLE 14 TO 16

Another superconductor comprising a Bi—Sb—Sr—Ba—Ca—Cu oxide was prepared in the same manner as in Examples 1 to 13. By the change in electric resistance, a 100K-class superconductor was obtained.

Similarly, a Bi—As—Ba—Mg—Ca—Cu oxide and a Bi—Be—Ca—Cu oxide were prepared.

EFFECTS OF THE INVENTION

A 100K-class oxide superconductor having a chemical composition quite different from those of the conventional ones is provided by the present invention. It has a very remarkable industrial and academic significance as a superconductor not containing a rare-earth element at all.

As compared with the conventional ones, there is available a high-temperature superconductor excellent in reliability and stability, easily and at a high reproducibility because of non-sensitivity of superconductivity to a series of manufacturing and heat treatment processes such as calcination, sintering and cooling. This forms a very important advantages for forming process into such as wires and thin films. The high density of the sinter gives a high Jc.

The present invention, not requiring rate-earth elements maldistributed on the earth, is far more advantageous than the conventional ones in terms of resources supply and provides industrially very useful effects.

The present invnetion provides also a solution to the problem of the resources since liquefied nitrogen may be used as a cooling medium.

What is claimed is:

1. A high-temperature oxide superconductor which comprises an oxide expressed as Bi—Sr—Ca—Cu Oxide.

2. A high-temperature oxide superconductor which comprises an oxide expressed as $(Bi_{1-x}A_x)$—B—C—Cu oxide, where A is Sb and/or As; B and C are elements different from each other, each being one or more elements selected from the group consisting of Be, Mg, Ca, Sr and Ba; and $0 \leq x \leq 1$.

3. A high-temperature oxide superconductor composition having a nominal formula $$Bi_1Sr_yCa_zCu_{2+d}O_n$$ 

where $0.1 \leq y \leq 5$, $0.1 \leq z \leq 5$ and $-1 \leq d$ and the amount of oxygen (n) is sufficient to provide a composition that exhibits zero electrical resistance at a temperature of 65° K. or above.

4. A composition according to claim 3 where y=1, z=1, d has a value of from about −1 to about 7 and which exhibits a superconducting transition midpoint temperature of 108° K. or above.

5. A composition according to claim 4 where the value of d is about 0 or about 1.

* * * * *